United States Patent
Riedel et al.

(10) Patent No.: US 6,570,300 B1
(45) Date of Patent: May 27, 2003

(54) PIEZOELECTRIC BENDING TRANSDUCER AND METHOD FOR PRODUCING THE TRANSDUCER

(75) Inventors: Michael Riedel, Niederfüllbach (DE); Hans-Jürgen Sestak, Lichtenfels (DE)

(73) Assignee: Siemens Aktiengesellschaft, Munich (DE)

( * ) Notice: Subject to any disclaimer, the term of this patent is extended or adjusted under 35 U.S.C. 154(b) by 189 days.

(21) Appl. No.: 09/198,217

(22) Filed: Nov. 23, 1998

Related U.S. Application Data

(63) Continuation of application No. PCT/DE97/00974, filed on May 14, 1997.

(30) Foreign Application Priority Data

Sep. 14, 1998 (DE) .......................................... 196 20 826

(51) Int. Cl.$^7$ ............................................... H01L 41/08
(52) U.S. Cl. ...................... 310/363; 310/330; 310/332; 310/364
(58) Field of Search ............................... 310/330–332, 310/363, 364, 366

(56) References Cited

U.S. PATENT DOCUMENTS

| | | | |
|---|---|---|---|
| 2,106,143 A | * 1/1938 | Williams | 310/363 |
| 3,622,815 A | * 11/1971 | Schafft | 310/332 |
| 3,629,625 A | * 12/1971 | Schafft | 310/332 |
| 3,872,332 A | 3/1975 | Butter | 310/363 |
| 4,078,160 A | * 3/1978 | Bost | 310/364 X |
| 4,140,936 A | * 2/1979 | Bullock | 310/363 X |
| 4,404,489 A | * 9/1983 | Larson, III et al. | 310/363 X |
| 4,545,041 A | * 10/1985 | Tims et al. | 310/319 X |
| 4,651,310 A | * 3/1987 | Kaneko | 310/334 X |
| 4,701,659 A | * 10/1987 | Pujii et al. | 310/364 X |
| 4,786,837 A | * 11/1988 | Kalnin et al. | 310/364 X |
| 5,126,615 A | 6/1992 | Takeuchi et al. | 310/330 |
| 5,210,455 A | 5/1993 | Takeuchi et al. | 310/330 |

FOREIGN PATENT DOCUMENTS

| | | |
|---|---|---|
| DE | 34 34 726 C2 | 12/1989 |
| DE | 40 25 436 A1 | 2/1992 |
| DE | 43 37 265 C1 | 3/1995 |
| DE | 195 20 796 A1 | 12/1996 |
| EP | 0 468 796 A1 | 2/1991 |
| EP | 0 455 342 B1 | 1/1995 |
| EP | 0 709 195 A1 | 5/1996 |

OTHER PUBLICATIONS

International Publication No. WO 92/06511 (Dam et al.), dated Apr. 16, 1992.
Patent Abstracts of Japan No. 1–282878 (Hiroshi), dated Nov. 14, 1989.

\* cited by examiner

*Primary Examiner*—Mark O. Budd
(74) *Attorney, Agent, or Firm*—Laurence A. Greenberg; Werner H. Stemer; Gregory L. Mayback

(57) ABSTRACT

A bending transducer has a piezoelectret carried on a substrate of electrically insulating material. An electrically conductive coating, such as a foil, a grid foil, a grid mesh, or mutually parallel strips, connects the inner electrode of the piezoelectret to the substrate and forms electrical contact with the inner electrode at a number of points. The bending transducer is particularly suited for driving a drafting, weaving or knitting machine in the textile industry.

18 Claims, 4 Drawing Sheets

PIEZOELECTRIC BENDING TRANSDUCER AND METHOD FOR PRODUCING THE TRANSDUCER

CROSS-REFERENCE TO RELATED APPLICATION

This is a continuation of copending International application No. PCT/DE97/00974, filed on May 14, 1997, which designated the United States.

BACKGROUND OF THE INVENTION

FIELD OF THE INVENTION

The invention relates to a piezoelectric bending transducer with an electrically insulating substrate that carries a piezoelectret and to a method for producing such a piezoelectric element. The invention, in particular, is concerned with the problem of ensuring reliable electrical contacting for a piezoelectric element with an insulating substrate, in particular in the context of severe mechanical loading.

Bending transducers of the type with which the invention is concerned serve—hereafter referred to, more generally, as piezoelectric elements—principally utilize the indirect or reciprocal piezoelectric effect, i.e., the conversion of electrical energy into mechanical energy. However, such piezoelectric elements are still also suitable for converting mechanical into electrical energy. The latter case utilizes the direct piezoelectric effect.

There is a multiplicity of technical applications for a piezoelectric element as described above. Such applications are, for example, as a piezoelectric printhead for an ink-jet printer, as a sound receiver or sound generator for microphones or loudspeakers, as a sensor for measuring acceleration or pressure, as an actuator in Braille lines in reading units for the visually impaired, in textile machines, in pneumatic valves, in recording measuring instruments or in non-contact surface-measuring instruments and so on.

The piezoelectric elements in accordance with U.S. Pat. No. 5,126,615 (EP-0 455 342 B1), and U.S. Pat. Nos. 5,210,455 and 5,681,410 (EP-0 468 796 A1), issued to Takeuchi et al., are formed of a layered structure. There, a piezoelectrically active material which exhibits the piezoelectric and/or the electrostrictive effect and is to be designated below as a piezoelectret, is applied to a carrier or substrate in order to improve the mechanical stability of the element or for the purpose of more effectively converting electrical energy into mechanical energy or vice versa. The piezoelectret is electrically contacted on both sides with electrodes in the form of a planar coating made from a conductive material. Depending on the application, the substrate can be provided on one or two sides with the layer sequence described. According to German patent DE-34 34 726 C2, it is also possible for a plurality of plies of piezoelectrets, including the electrodes, to be stacked one above the other. Depending on the number of the piezoelectrically active layers, the art refers to a monomorph, a bimorph, a trimorph, and so on, or, in general, to a multimorph piezoelectric element.

Piezoelectric elements with a non-conducting or electrically insulating substrate are disclosed in German patent DE-43 37 265 C1 and in German published patent application DE-40 25 436 A1. In the case of a bimorph piezoelectric element, it is possible by using an insulating substrate to connect the sides of the piezoelectrets which face the substrate, or the inner electrodes located thereupon to a different potential. It is thereby possible to drive such a piezoelectric element exclusively via the internal sides of the piezoelectrets which are insulated with respect to one another by the substrate, or via the inner electrodes, while the exterior sides or the outer electrodes are connected to zero potential or frame. The result is a shockproof piezoelectric element. However, non-conducting materials can be just as suitable for the substrate, because of specific properties other than the properties of electrical insulation, for example because of a coefficient of thermal expansion matched to the piezoelectret for the purpose of avoiding thermal stresses.

The piezoelectric element with an electrically insulating substrate is also shown in the post-published German application DE 195 20 796 A1 (not prior art). The substrate of that disclosure is provided with a metallization layer which leads from the edge of the substrate to the opposite side. This causes the inner electrodes of the piezo-ceramic elements carried on the two sides of the substrate to be pulled to the same electrical potential.

A non-conducting substrate naturally leads, however, to difficulty in making contact on the side facing the substrate, i.e., the inner side of the piezoelectret. It is known from DE-40 25 436 A1 in this regard to provide the inner side of the piezoelectret with an inner electrode in the form of a layer of metallization, to lead the metallization out beyond the edge of the piezoelectret, and to make contact with it there with the aid of a solder contact.

However, in the case of a piezoelectric element having a substrate made from an electrically insulating material, making contact with the inner side of the piezoelectret is ensured exclusively via the material of an inner electrode. A rupture of the inner electrode therefore disconnects a part of the piezoelectric element from the voltage supply for the inner electrode. The piezoelectric element is no longer serviceable. Since the inner electrode is rupture-prone, the service life of a piezoelectric element having an insulating substrate cannot compete with the service life of a piezoelectric element having a conductive substrate.

SUMMARY OF THE INVENTION

It is accordingly an object of the invention to provide a piezoelectric bending transducer and a production method, which overcomes the above-mentioned disadvantages of the heretofore-known devices and methods of this general type and which, with regard to the device, provides a substrate of electrically insulating material that remains completely serviceable (operationally functional) even in the case of material fatigue of an inner electrode. It is also the object of the invention to specify a method for producing such a piezoelectric element.

With the foregoing and other objects in view there is provided, in accordance with the invention, a piezoelectric bending transducer, comprising:

a substrate of electrically insulating material;
a piezoelectret carried on the substrate, the piezoelectret having an inner electrode towards the substrate; and
an electrically conductive coating between the inner electrode and the substrate forming an electrical contact at a plurality of locations with the inner electrode, wherein the conductive coating does not extend to a side of the substrate opposite from the piezoelectret.

In other words, the above-noted objects with regard to the piezoelectric element are satisfied by virtue of the fact that the substrate is provided with an electrically conductive coating which is in electrical contact at a number of sites with an inner electrode of a piezoelectret applied to the substrate and that the coating does not extend to the distal side of the substrate.

The invention proceeds in this case from the knowledge that, in the case of a piezoelectric element having a substrate, material fatigue, for example due to constant mechanical loading, leads during operation to rupturing or cracking of an inner electrode located between the substrate and the piezoelectret. Such material fatigue of the inner electrode occurs frequently, since the material of the inner electrode is additionally loaded by compressive or thermal stresses at the interface between the piezoelectret and the substrate. If the substrate consists of an electrically conductive material, such a rupture does not lead to functional failure of the piezoelectric element, since contacting continues to be ensured via the substrate. This requires only that the substrate makes electrical contact with the inner electrode at a sufficient number of sites. Such material fatigue of the inner electrode is therefore not observed at all in the case of a conductive substrate.

If, on the other hand, the substrate is electrically non-conducting, there is inserted between the substrate and the inner electrode of the piezoelectret an electrically conductive coating which is in electrical contact with the inner electrode at a number of sites. Contacting of the inner electrode is ensured in addition by the coating. The piezoelectric element remains serviceable in the event of material fatigue of the inner electrode. This holds, in particular, even if a high mechanical loading should also cause the conductive coating to rupture or crack, since it is unlikely for a rupture of the inner electrode and a rupture of the conductive coating to occur at the same site.

In accordance with an added feature of the invention, the coating is a metal foil suitable for attaching a solder contact, preferably a copper foil.

In accordance with another feature of the invention, a portion of the metal foil is inserted between the piezoelectret and the substrate.

In other words, contact is advantageously made between the inner electrode and the conductive coating via a metal foil that is suitable for attaching a solder contact. Particularly advantageous for this purpose are copper foils, which can easily be contacted and are commercially available in various thicknesses. For the purpose of contacting, a part of the metal foil can simply be inserted between the piezoelectret and the substrate. The solder contact for connection to an external voltage source is attached to the projecting, free part of the metal foil. As regards the serviceability of the piezoelectric element, it is not important in this case whether the metal foil is inserted between the piezoelectret and the conductive coating, between the conductive coating and the inner electrode or between the inner electrode and the piezoelectret. The most favorable configuration depends in this case on the process for reducing the piezoelectric element.

However, inserting a metal foil leads to bending of the layers surrounding the foil, which, in conjunction with mechanical loading by additional compressive or tensile stresses, defines a rupture joint which can lead to a functional failure. It is possible to avoid such a rupture joint by omitting the conductive coating at the site of the inserted part of the metal foil. In this case, contact is made between the conductive coating and the metal foil via the inner electrode. In order to avoid a functional failure of the piezoelectric element due to a crack of the inner electrode between the conductive coating and the inserted metal foil, the inserted end of the metal foil can, for example, be V-shaped. The same holds for that end of the conductive coating which adjoins the inserted part of the metal foil. Contacting thereby continues to be ensured in the case of a transversely extending crack in the inner electrode.

However, the rupture joint mentioned can also be avoided by choosing a sufficiently thin inserted metal foil. Metal foils with a thickness of less than 10 $\mu$m are suitable for normal piezoelectric elements.

In accordance with an additional feature of the invention, the substrate is longer than the piezoelectret and the conductive coating extends on a free part of the substrate where the coating makes contact with the metal foil. The contacting can be realized, in this case, by, for example, simply bonding over the conductive coating, extending on the free part of the substrate, with the metal foil in the form of a platelet, and placing the solder contact onto the platelet. The solder contact can also be placed directly onto the projecting conductive coating given a suitable material for the conductive coating.

In accordance with a further feature of the invention, the conductive coating is a ductile foil, i.e., a flexible and deformable foil. The deformability can be achieved in this case by a suitable material such as, for example, a flexible plastic, or by using a very thin foil. Thus, for example, a metal foil with a thickness of less than 100 $\mu$m is suitable as ductile foil. The ductility precludes the conductive coating from cracking under mechanical loading or shear stress. The foil can be applied to the substrate or to the inner electrode of the piezoelectret by bonding, fusing or by other connection techniques. The substrate is then bonded, welded or otherwise connected to the piezoelectret to form the piezoelectric element. The electrical contact can be made between the foil and the inner electrode by means of a conductive adhesive, or a non-conducting adhesive is applied so thinly that there is still direct contact through the adhesive between the foil and the inner electrode owing to microscopic roughnesses of the foil and the inner electrode.

In accordance with again another feature of the invention, the conductive coating is a mesh grid. The use of the mesh grid between the piezoelectret and the substrate is substantially simplified with the use of the mesh grid as the conductive coating. A "mesh grid" is to be understood here as a substantially two-dimensional body which has openings. Such a body is, for example, a gauze or a perforated foil. The inner electrode can then be bonded or otherwise connected to the substrate directly via the openings in the mesh grid. The mesh grid can be placed on loosely before being connected. A mesh grid also provides contact with the inner electrode at a sufficient number of sites. Moreover, the production costs can be lowered by savings in material.

If the piezoelectric element is used as a moving element or adjusting element, mechanical loading frequently occurs through repeated deflection of the element in a prescribed direction. A rupture of the inner electrode then occurs with high probability perpendicular to this deflection direction. The mesh grid can advantageously be constructed in the form of parallel strips for such an element. The definition of "mesh grid" as used herein, therefore, also includes a plurality of mutually parallel strips. The strips are thereby preferably arranged perpendicular to the deflection direction of the piezoelectric element. In particular, in individual cases a single strip can suffice to ensure the serviceability of the piezoelectric element in the event of a rupture of the inner electrode. A strip can, for example, be applied to the substrate by bonding, by welding or fusing. However, it is also conceivable for a strip to be placed on loosely before the substrate is connected to the piezoelectret to form the piezoelectric element. It is also possible for both a mesh grid and mutually parallel strips to be applied in the form of a paste or liquid with the aid of a printing technique, for example with the aid of a screen printing technique.

In accordance with again other features of the invention, the conductive coating consists of a metal, or of an electrically conducting plastic such as, for instance, carbon polymer or an epoxy resin reinforced with metal fibers. The inner electrode may be a metallization layer.

A metal or an electrically conductive plastic is suitable in principle as material for the conductive coating. As noted, a carbon polymer or an epoxy resin reinforced with metal fibers is particularly advantageous as a plastic. A carbon polymer is understood here as a heat-curing resin with graphite as pigment. The carbon polymer can be applied before curing in the form of a paste, for example, by means of the screen printing technique. Epoxy resin reinforced with metal fibers with a metal gauze is suitable, in particular, in the form of a so-called prepreg (a not yet cured, soft blank preimpregnated with epoxy resin). The substrate can then be permanently connected to the inner electrode of the piezoelectret via the conductive coating by inserting the conductive coating, in the form of a prepreg, loosely between the substrate and the inner electrode and subsequently applying pressure to press the substrate and piezoelectret together and bonding them with a heat treatment accompanied by curing of the prepreg. The inner electrode of the piezoelectret is advantageously constructed as a metallization. The metallization can be applied to the surface of the piezoelectret by sputtering, vapor deposition of a metal or with the screen printing technique. A metallization in the form of a thin, metallic surface coating is suitable, in particular, for the generation of a homogeneous electric field in the piezoelectret, and thus for optimum energy conversion. However, owing to direct contact with the piezoelectret and to the suitable thickness, a layer metallization is particularly at risk of rupture or cracking.

In accordance with again an additional feature of the invention, the piezoelectret includes an outer electrode on a side thereof averted from the substrate. The outer electrode is preferably coated with a conductive, ductile layer.

In accordance with again a further feature of the invention, the substrate overlaps the conductive coating and the inner electrode at edge regions thereof.

In accordance with yet an added feature of the invention, the conductive coating and the inner electrode have exposed portions, and an electrically insulating lacquer covers the exposed portions.

The outer electrode can be constructed, similarly to the inner electrode, as a metallization. In order to avoid functional failures, the outer electrode can also be coated with a conductive ductile layer. Particularly suitable for this is a carbon polymer, which has a high bond strength at the same time as high flexibility. It is also conceivable to construct the outer electrode itself as a conductive, ductile coating of the piezoelectret.

The piezoelectric element having a substrate made from a non-conducting material is highly shockproof. The driving voltage may be applied only via the inner electrode, while the outer electrode is at zero potential. The live inner electrode is preferably insulated completely from the outside by virtue of the fact that the substrate made from electrically insulating material overlaps the conductive coating and the inner electrode at edge regions, that is to say at exposed lateral surfaces. As an alternative, exposed, live parts of the conductive coating and of the inner electrode can preferably be provided with the electrically insulating lacquer.

In accordance with yet an additional feature of the invention, the substrate is a flat platelet with two flat sides each with the conductive coating, and wherein a piezoelectret is disposed on each of the two flat sides of the flat platelet. This feature provides for a particularly effective conversion from electrical into mechanical energy. Such a piezoelectric element is particularly suitable for use as a bending transducer or actuator. Such bending transducers are used in the textile industry to drive weaving, knitting or drafting machines, in particular to produce patterns with the aid of the Jacquard technique. Furthermore, such an actuator is used for reading units for the blind with the purpose of actuating individual key components, in pneumatic valves, and in video/audio units.

In accordance with yet a further feature of the invention, the piezoelectret is a piezoceramic. All materials which exhibit the piezoelectric or electrostrictive effect are suitable in principle for the piezoelectrets. Certain oxide ceramics, for example lead-zirconate-titanium, which permit adaptation to different requirements owing to their composition, are particularly advantageous. For such a ceramic or piezoceramic to exhibit the piezoelectric effect, it has to be polarized in a homogeneous electric field. This produces in the piezoceramic a polar axis which is required for the occurrence of the piezoelectric effect. This polarization can be performed in a particularly simple way if the piezoceramic provided for the piezoelectric element has electrodes on both sides in the form of a layer of metallization. The desired, homogeneous electric field is generated in this case by applying a sufficiently high electric voltage.

The piezoceramic can be polarized either before or after bonding to the substrate. This generally requires an electric field of a few kV/mm. Since any compressive or tensile stress inside the piezoceramic leads to depolarization and thus to the attenuation of the piezoelectric effect, the coefficients of thermal expansion of the substrate and the piezoceramic should be matched to one another. This is the case whenever, instead of a carbon-fiber-reinforced epoxy resin, the substrate consists of a glass-fiber-reinforced epoxy resin, and the piezoceramic consists of ion the said lead-zirconate-titanium ceramic.

With the above and other objects in view there is also provided, in accordance with the invention, a method of producing a bending transducer, which comprises:

connecting a substrate of electrically insulating material with a piezoelectret having an inner electrode facing towards the substrate; and placing an electrically conductive coating between the substrate and the piezoelectret such that electrical contact is made between the conductive coating and an inner electrode of the piezoelectret at a plurality of locations.

In accordance with a further mode of the process, a mesh grid is placed on a prepreg of a thermosetting plastic forming the substrate, and the prepreg is connected to the piezoelectret by heat treating with the inclusion of the mesh grid.

In accordance with a concomitant feature of the invention, the conductive coating is applied on the substrate in the form of a metal-gauze prepreg, such as a copper-gauze prepreg, and the metal-gauze prepreg is connected to the piezoelectret by heat treatment.

It is advantageous to use as substrate a prepreg of a thermosetting plastic, preferably a prepreg of a glass-fiber-reinforced epoxy resin. In this case, there is no need for an adhesive, either for bonding the conductive coating to the substrate or for bonding the conductive coating to the inner electrode. The conductive coating is firstly placed loosely, in the form of a mesh grid, onto the prepreg or onto the inner electrode, or applied by means of a printing technique. The substrate, conductive coating and piezoelectret are subsequently placed loosely in an appropriate form for bonding purposes. Light pressing causes the prepreg to flow around the mesh grid, which is directly connected to the inner electrode by being placed on loosely, and bonds the substrate through the mesh grid to the inner electrode of the piezoelectret. Alternatively, it is also conceivable to use a prepreg, for example a copper-gauze prepreg, for the conductive coating itself. Applying a final heat treatment cures the prepreg irreversibly while forming the thermosetting plastic, and the result is a permanent and stable bonding of the piezoelectric element.

Although the invention is illustrated and described herein as embodied in piezoelectric bending transducer and a method for producing the element, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
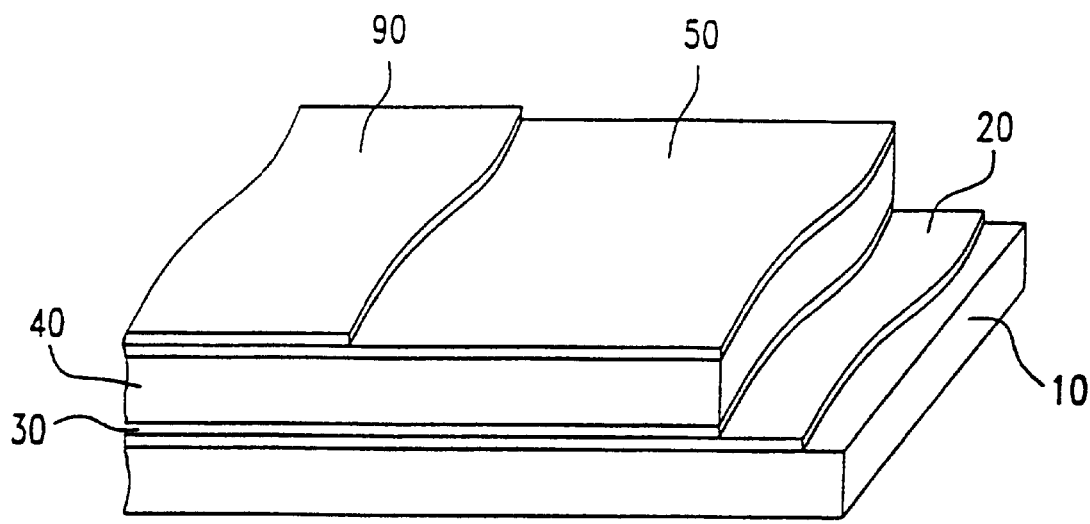
FIG. 1 is a partial perspective view of a piezoelectric element with a conductive foil coating on a substrate.

Referring now to the figures of the drawing in detail and first, particularly, to FIG. 1 thereof, there is seen a laminate structure or layered structure of a piezoelectric element having a substrate 10 made from an electrically insulating material. An electrically conductive coating is applied to the substrate 10. The coating in FIG. 1 is a foil 20 which covers the substrate 10 in a planar fashion. The piezoelectret 40 is disposed on the conductive foil 20. The piezoelectret 40 is provided with an inner electrode 30 and an outer electrode 50. The two electrodes 30 and 50 are respectively applied to the piezoelectrode 40 in the form of a thin metallization layer. The conductive foil 20 can be bonded or fused to the substrate 10 as well as to the inner electrode 30. Electrical contact exists between the inner electrode 30 and the conductive foil 20. The application of an electric voltage to the two electrodes 30 and 50 leads to compression or expansion of the piezoelectret 40. If a piezoceramic is used as the piezoelectret 40, applying such a voltage leads to bending of the piezoelectric element. This is due to the fact that piezoceramics exhibit a transverse piezoelectric effect. Compression or expansion vectors are oriented perpendicularly to the direction of the applied electric field.

A high mechanical loading of the piezoelectric element because of bending easily leads to cracks in the piezoelectret 40 transverse to the bending direction. Such a crack can lead to bursting of the inner electrode 30 and thus to functional failure of the piezoelectric element. The additionally inserted conductive foil 20 of the electrically insulating substrate 10 leads in such a case to maintaining the serviceability, since contact still continues to be made with the inner electrode 30 by means of the conductive foil 20. A rupture of the outer electrode 50 is rarely observed, since here the compressive or tensile stresses caused by bonding the piezoelectret 40 to the substrate 10 do not occur. This does not hold for a bending transducer. Here, in particular, the outer electrode 50 can also crack or break owing to heavy loading. The functional failure of the piezoelectric element because of such a rupture of the outer electrode 50 can also be avoided by placing a conductive coating 90 onto the outer electrode 50.

Figure 2:
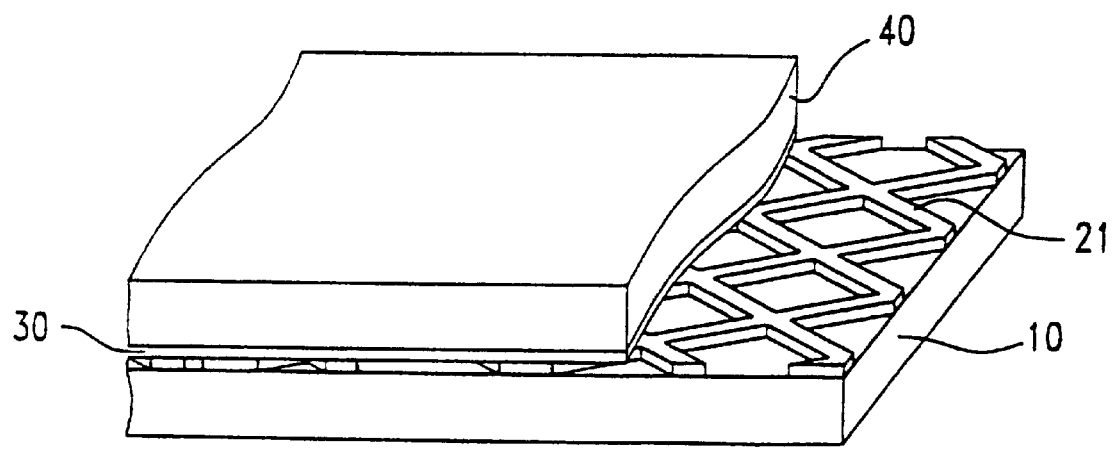
FIG. 2 is a similar perspective view of a piezoelectric element with a conductive coating on a substrate in the form of a lattice.

Referring now to FIG. 2, the conductive coating of the substrate 10 may be constructed as a grid network 21 or mesh grid 21. It is possible in this way to save material and yet to maintain full functionality of the piezoelectric element in the event the inner electrode 30 ruptures. A commercially available copper gauze is suitable, for example, as the lattice grid. The piezoelectret 40 has no outer electrode 50 in FIG. 2. Contact is made between the distal side of the piezoelectret 40 (the side averted from the substrate 10) and a part at ground potential only upon installation in an appropriate unit. For driving purposes, the inner electrode 30, or the conductive coating, here in the form of a mesh grid 21, is then connected to an appropriate potential with respect to frame (i.e., is to say ground potential).

Figure 3:
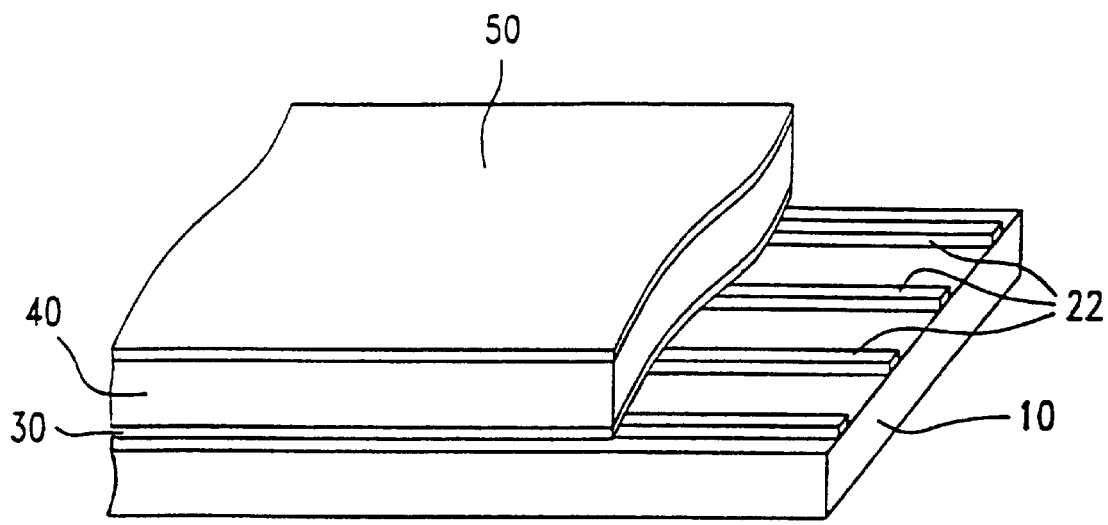
FIG. 3 is a similar perspective view of a piezoelectric element with a conductive coating on a substrate in the form of a plurality of parallel strips.

Referring now to FIG. 3, there is shown a further embodiment of the conductive coating within the otherwise similar laminate structure. The conductive coating is reduced here to a number of mutually parallel strips 22. The strips are preferably perpendicular to a bending of the piezoelectric element that is to be expected. In this case, the strips 22 are situated transverse to the cracks to be expected in the inner electrode 30. The serviceability of the element illustrated in FIG. 3 is thereby maintained in the event of bending perpendicular to the individual layers.

Figure 4:
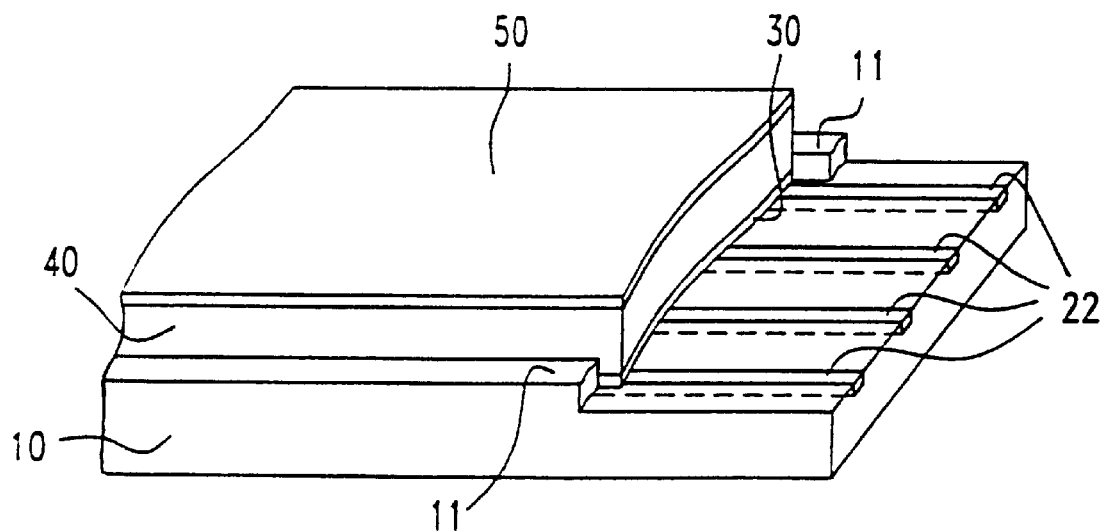
FIG. 4 is a similar perspective view of a piezoelectric element with a conductive coating in the form of a plurality of parallel strips embedded into the substrate.

Bonding the conductive coating both to the substrate 10 and to the inner electrode 30, which is technically a very complicated operation, is eliminated when a prepreg is used as the material for the substrate 10. The layered structure of a piezoelectric element with a substrate of thermosetting material is shown in FIG. 4. There, the conductive "coating" is recessed into the substrate 10 in the form of parallel strips 22. The substrate 10 consists, for example, of a glass-fiber-reinforced epoxy resin. The material for the conductive strips 22 is a carbon polymer. A so-called prepreg, that is to say a glass-fiber-reinforced plastic not yet fully cured, is used for the substrate 10 in the method of production. A carbon polymer is applied to the prepreg as conductive coating in the form of a number of parallel strips 22 with the aid of the screen printing technique. Subsequently, the piezoelectret 40 is placed with the inner electrode 30 and the outer electrode 50 onto the substrate 10 provided with the strips 22, and introduced into a mold. As pressure is applied, the not yet fully cured plastic firstly flows around the applied conductive strips 22 and bonds to the inner electrode 30. At the same time, however, the electrical contact between the conductive strips 22 and the inner electrode 30 remains. The prepreg is cured during a heat treatment, thus producing a permanent bonding of the substrate to the inner electrode.

The substrate 10 in FIG. 4 overlaps the inner electrode 30 and the conductive strips 22 in the edge region. The strip 11 constructed for this purpose serves to ensure that the piezoelectric element is shockproof.

Figure 5:
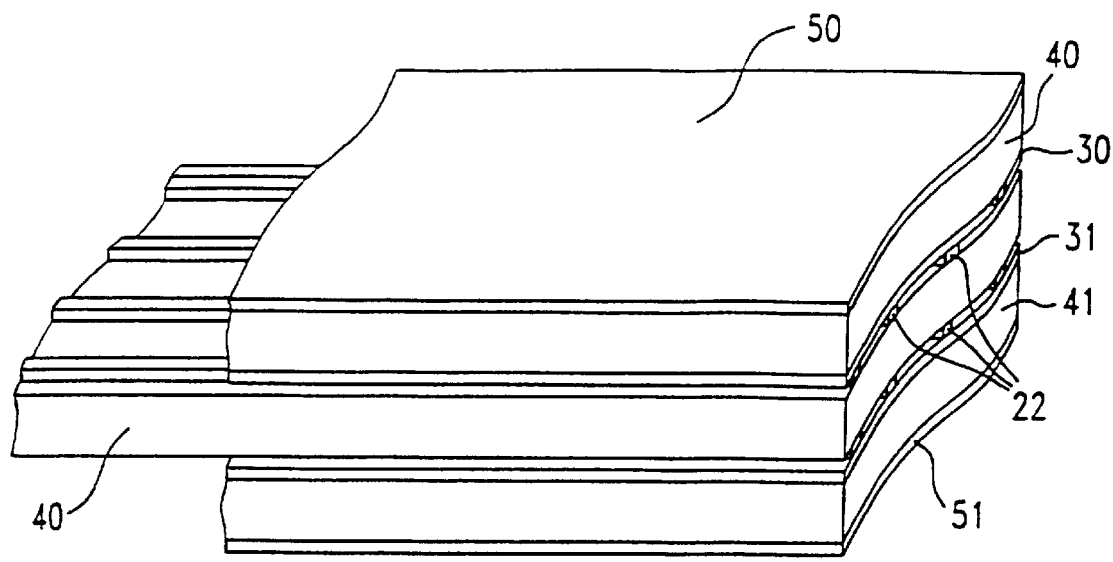
FIG. 5 is a partial perspective view of a piezoelectric element where the substrate carries a double-sided coating.

Referring now to FIG. 5, there is shown a piezoelectric element having a substrate 40 made from an electrically insulating material. The substrate 40 has a coating on both sides. A conductive coating in the form of strips 22, an inner electrode 30 or 31, a piezoelectret 40 or 41 and an outer electrode 50 or 51 are arranged in the specified sequence on both sides of the substrate 40. Such a so-called dimorph structure is particularly suitable when piezoceramics are used for the piezoelectrets 40, 41. It is impermissible for piezoceramics to be exposed to an electric field which opposes their direction of polarization. Such an electric field could lead to depolarization and thus to a loss of the piezoelectric effect.

The two outer electrodes 50, 51 are connected to ground potential for the purpose of driving the piezoelectric element represented in FIG. 5. The two inner electrodes 30 and 31 are connected alternately to 0 and 200 volts, 200 V representing a normal operating voltage for a piezoceramic. If the inner electrode 31 is at 0 volts, the inner electrode 30 is at+200 volts, and vice versa. If the direction of polarization of the two piezoceramics 40, 41 points away from the substrate 10 (i.e., in the direction of the applied field!),the advantage of shockproofness can be combined with a simple configuration, by means of which the piezoelectric element can be deflected in two opposite spatial directions. Only one of the piezoelectrets 41 and 40 is thereby respectively exposed to an electric field, i.e., it is active.

The shockproofness of the piezoelectric element represented in FIG. 5 is ensured by providing the open, live edge regions (carrying a voltage) with an electrically insulating lacquer. It is also possible, as already represented in FIG. 4, to configure the substrate in such a way that it overlaps the conductive coating applied on both sides, here in the form of strips 22, and the two inner electrodes 30, 31.

Figure 6:
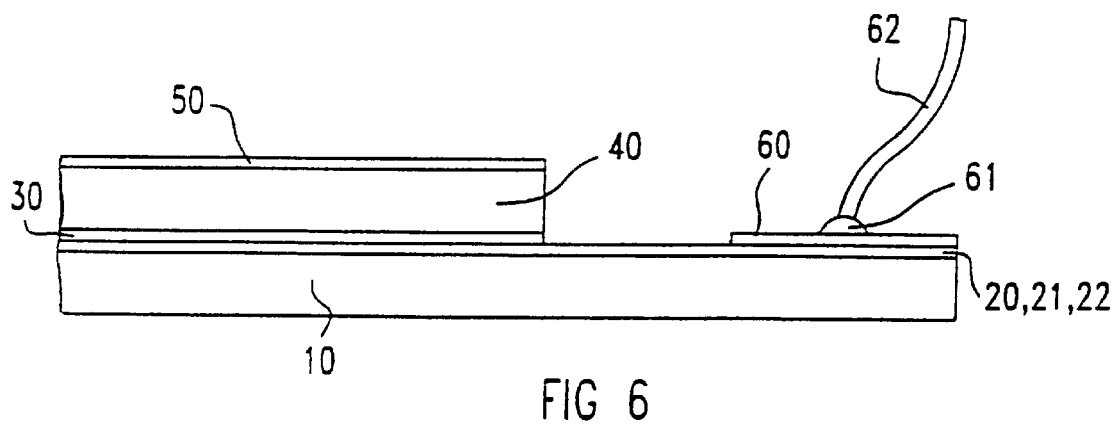
FIG. 6 is a diagrammatic side section taken through a piezoelectric element wherein contact is made via a metal foil placed on the structure.

Referring now to FIG. 6, contact is made between the piezoelectric element and the electrically insulating substrate material, by providing the substrate 10 together with the conductive coating 20, 21, 22 only partly with the piezoelectret 40. On the free part of the substrate 10, a metal foil 60 is bonded onto the conductive coating 20, 21, 22. A connecting cable 62 is fastened to this metal foil 60 via a solder contact 61.

Figure 7:
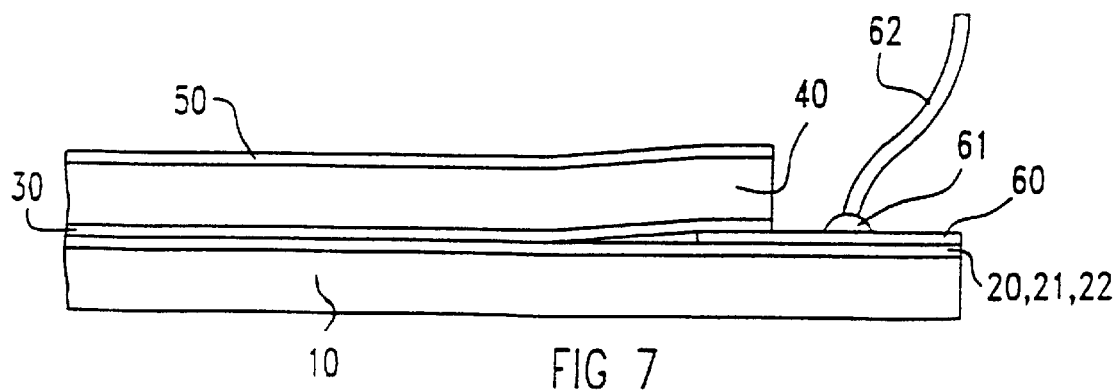
FIG. 7 is a similar view of a section through a piezoelectric element wherein contact is made via a metal foil that is partly inserted.

An alternative possibility for configuring the contact is shown in FIG. 7. Here, a metal foil 60 is inserted between the inner electrode 30 and the conductive coating 20, 21, 22. Here, as well, for the purpose of a better contact and to improve the fastening of the metal foil 60, the substrate 10 and the conductive coating 20, 21, 22 are not completely covered by the piezoelectret 40. Once again, a connecting cable 62 is fastened via a solder contact 61 on the free part of the metal foil 60. A rupture joint can result from the bending of the layers located in the immediate vicinity of the inserted metal foil 60. However, the production method is technically simpler than for the element represented in FIG. 6. The conductive coating 20, 21,22 at the site of the metal foil 60 can be omitted in order to avoid the rupture joint.

Figure 8:
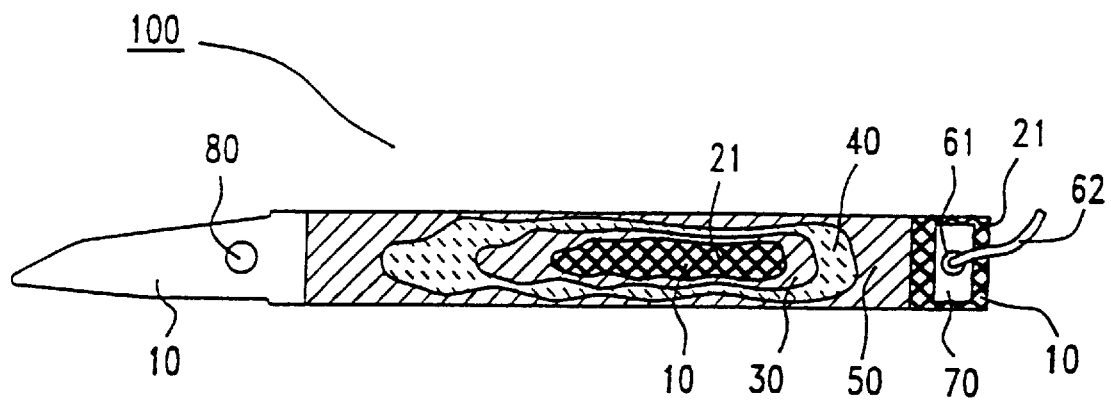
FIG. 8 is a partly broken-away view of a bending transducer for controlling the needle of a drafting, weaving, or knitting machine, wherein the substrate carries a conductive coating in the form of a mesh grid.
Figure 9:
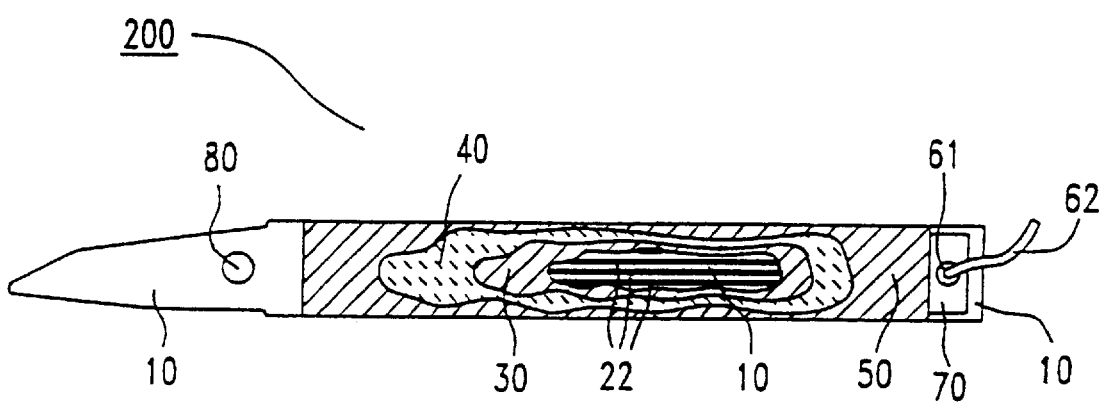
FIG. 9 is a similar view of a piezoelectric element in the form of a bending transducer for controlling the needle of a drafting, weaving or knitting machine, wherein the substrate carries a conductive coating formed of a number of parallel strips.

Referring now to FIGS. 8 and 9, there are shown a piezoelectric element each in the form of a bending transducer 100, 200 for controlling the needle in a weaving, drafting or knitting machine having a piezoelectric element according to the invention. The substrate 10, made from an electrically insulating material, finishes in a rounded form which is formed with a bore 80. This design serves to hold a folding needle for a weaving or knitting machine. Contact is made with the bending transducer 100 or 200 at the opposite end via a connecting cable 62, a solder contact 61 and a copper foil 70 with a thickness of 9 µm. Both bending transducers 100 and 200 have the coating represented here on both sides. It is only for the sake of simplicity that only one side of each bending transducer is represented.

The bending transducer 100 represented in FIG. 8 has a substrate 10 with a conductive coating in the form of a mesh grid 21. A copper gauze with a thickness of 50 µm is provided as the mesh grid 21. The substrate 10 and the copper gauze are coated, as represented in part, with a piezoceramic 40 which has an inner electrode 30 and an outer electrode 50. The copper gauze of the conductive mesh grid 21 is freely accessible at the end of the bending transducer 100 opposite the bore 80. There, a thin copper foil 70 for making contact with the connecting wire 62 via a solder contact 61 is bonded via the copper gauze. A carbon polymer thick film paste (not represented here), which has the advantage of being resistant to abrasive wear, is applied to the outer electrode 50. All the lateral parts of the bending transducer 100 are provided with an electrically insulating lacquer.

The bending transducer 200 represented in FIG. 9 has the same layered structure as the bending transducer 100 in FIG. 8. Only the conductive coating is constructed here in the form of a number of parallel strips 22. Furthermore, for the purpose of making contact with the bending transducer 200, a copper foil 70 having a thickness, already mentioned, of 9 µm, is inserted, as represented in FIG. 7, between the inner electrode 30 and the conductive coating. The conductive strips 21 consist of a carbon polymer and have a thickness of approximately 10 µm. The strips 22 should not be too thick, since otherwise rupture joints are produced thereby.

The substrate of the two bending transducers 100 and 200 consists of a glass-fiber-reinforced epoxy resin. During production, the epoxy resin is prepared as a prepreg, with the result that the substrate 10 is bonded directly to the inner electrode 30 of the piezoelectret 40, as shown in FIG. 4, whereby the material flows around the conductive coating.

We claim:

1. A piezoelectric bending transducer, comprising:
    a substrate of electrically insulating material;
    an electromechanical piezoelectret for converting electrical energy into mechanical energy, said piezoelectret being carried on said substrate and having an inner electrode towards said substrate; and
    an electrically conductive coating between said inner electrode and said substrate forming an electrical contact at a plurality of locations with said inner electrode, and wherein said conductive coating does not extend to a side of said substrate opposite from said piezoelectret, and said substrate overlaps said conductive coating and said inner electrode at edge regions thereof.

2. The bending transducer according to claim 1, wherein said coating is a metal foil suitable for attaching a solder contact.

3. The bending transducer according to claim 2, wherein said coating is a copper foil.

4. The bending transducer according to claim 2, wherein a portion of said metal foil is inserted between said piezoelectret and said substrate.

5. The bending transducer according to claim 2, wherein said substrate is longer than said piezoelectret and said conductive coating extends on a free part of said substrate where said coating makes contact with said metal foil.

6. The bending transducer according to claim 1, wherein said conductive coating is a ductile foil.

7. The bending transducer according to claim 1, wherein said condutive coating is a mesh grid.

8. The bending transducer according to claim 7, wherein said mesh grid is formed of a plurality of mutually parallel strips.

9. The bending transducer according to claim 1, wherein said conductive coating consists of a metal.

10. The bending transducer according to claim 1, wherein said conductive coating consists of an electrically conducting plastic.

11. The bending transducer according to claim 10, wherein said conducting plastic is a carbon polymer.

12. The bending transducer according to claim 10, wherein said plastic is a metal fiber reinforced epoxy rein.

13. The bending transducer according to claim 1, wherein said inner electrode is a metallization layer.

14. The bending transducer according to claim 1, wherein said piezoelectret includes an outer electrode on a side thereof averted from said substrate.

15. The bending transducer according to claim 14, wherein said outer electrode is coated with a conductive, ductile layer.

16. A piezoelectric bending transducer, comprising;

a substrate of electrically insulating material;

an electromechanical piezoelectret for converting electrical energy into mechanical energy, said piezoelectret being carried on said substrate and having an inner electrode towards said substrate; and a metal foil suitable for attaching a solder contact, said metal foil forming an electrically conductive coating between said inner electrode and said substrate with electrical contact at a plurality of locations with said inner electrode, wherein said metal foil does not extend to a side of said substrate opposite from said piezoelectret and wherein said metal foil and said inner electrode have exposed portions, and including an electrically insulating lacquer covering said exposed portions.

17. The bending transducer according to claim 1, wherein said substrate is a flat platelet with two flat sides each with said conductive coating ,and wherein said piezoelectret is one of two piezoelectret respectively disposed on each of said two flat sides of said flat platelet.

18. The bending transducer according to claim 1, wherein said piezoelectret is a piezoceramic.

* * * * *

UNITED STATES PATENT AND TRADEMARK OFFICE
CERTIFICATE OF CORRECTION

PATENT NO. : 6,570,300 B1
DATED : May 27, 2003
INVENTOR(S) : Michael Riedel and Hans-Jürgen Sestak It is certified that error appears in the above-identified patent and that said Letters Patent is hereby corrected as shown below:

<u>Title page,</u>
Item [30], Foreign Application Priority Data, should read as follows:

-- May 23, 1996     (DE)   …………. 196 20 826 --

Signed and Sealed this

Ninth Day of September, 2003

JAMES E. ROGAN
*Director of the United States Patent and Trademark Office*